(12) United States Patent
Rofougaran et al.

(10) Patent No.: US 8,621,175 B2
(45) Date of Patent: *Dec. 31, 2013

(54) WIRELESSLY CONFIGURABLE MEMORY DEVICE

(75) Inventors: Ahmadreza (Reza) Rofougaran, Newport Coast, CA (US); Timothy W. Markison, Mesa, AZ (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/429,685

(22) Filed: Mar. 26, 2012

(65) Prior Publication Data

US 2012/0185665 A1 Jul. 19, 2012

Related U.S. Application Data

(63) Continuation of application No. 12/202,260, filed on Aug. 30, 2008, now Pat. No. 8,175,108, which is a continuation-in-part of application No. 12/026,681, filed on Feb. 6, 2008, now abandoned, and a continuation-in-part of application No. 11/700,285, filed on Jan. 31, 2007, now Pat. No. 8,116,294, and a continuation-in-part of application No. 11/888,068, filed on Jul. 31, 2007, now Pat. No. 8,010,735.

(51) Int. Cl.
*G06F 12/00* (2006.01)

(52) U.S. Cl.
USPC ........... 711/171; 711/105; 711/115; 370/329; 370/338; 370/344

(58) Field of Classification Search
USPC .......... 370/310, 343, 344, 329, 338; 711/105, 711/170–171; 365/236.05, 189.02; 455/431, 41.2
See application file for complete search history.

(56) References Cited

U.S. PATENT DOCUMENTS

| | | | |
|---|---|---|---|
| 5,502,683 A * | 3/1996 | Marchioro | 365/230.05 |
| 5,754,948 A * | 5/1998 | Metze | 455/41.2 |
| 6,505,305 B1 * | 1/2003 | Olarig | 714/5.11 |
| 6,715,104 B2 * | 3/2004 | Imbert de Tremiolles et al. | 714/25 |
| 6,876,276 B2 * | 4/2005 | Amano et al. | 333/204 |
| 2006/0178142 A1 * | 8/2006 | Lovberg et al. | 455/431 |
| 2010/0146199 A1 * | 6/2010 | Shaeffer et al. | 711/105 |

\* cited by examiner

*Primary Examiner* — Charles C Jiang
*Assistant Examiner* — Mohamed Kamara
(74) *Attorney, Agent, or Firm* — Garlick & Markison; Jessica W. Smith

(57) ABSTRACT

A configurable memory includes an interface section, a plurality of memory modules, and an internal configuration section. The interface section includes a millimeter wave (MMW) transceiver and interfaces with one or more external components. Each the plurality of memory modules includes a memory MMW transceiver and a plurality of memory cells. The internal configuration section includes a memory management unit and a memory management MMW transceiver. The memory management unit is operable to determine configuration of at least some of the plurality of memory modules to form a memory block, identify an interface MMW transceiver to provide a wireless link to the memory block, and generate a configuration signal based on the determined configuration and the identified interface MMW transceiver. The memory management MMW transmits the MMW configuration signal to the identified interface MMW transceiver and the MMW transceivers of the memory modules.

20 Claims, 16 Drawing Sheets

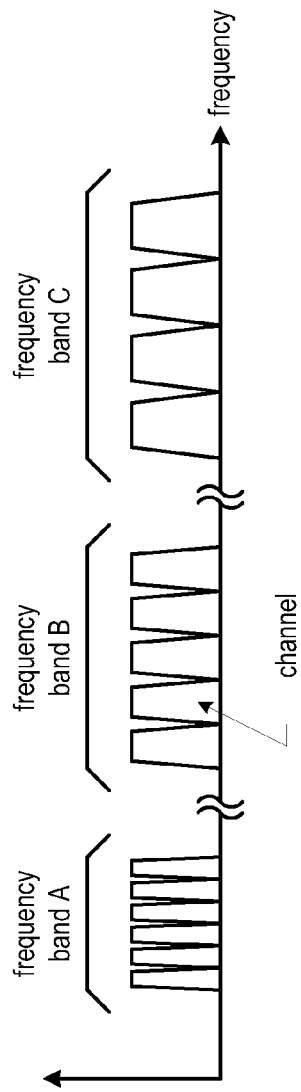

WIRELESSLY CONFIGURABLE MEMORY DEVICE

CROSS REFERENCE TO RELATED PATENTS/PATENT APPLICATIONS

The present U.S. Utility patent application claims priority pursuant to 35 U.S.C. §120, as a continuation, to the following U.S. Utility patent application which is hereby incorporated herein by reference in its entirety and made part of the present U.S. Utility Patent Application for all purposes:

1. U.S. Utility patent application Ser. No. 12/202,260, entitled "Wirelessly Configurable Memory Device,", filed Aug. 30, 2008, , which claims priority pursuant to 35 U.S.C. §120, as a continuation-in-part (CIP), to the following U.S. Utility Patent Applications which are hereby incorporated herein by reference in their entirety and made part of the present U.S. Utility patent application for all purposes:
   a. U.S. Utility patent application Ser. No. 12/026,681, entitled "Computing Device with Handheld and Extended Computing Units," filed Feb. 6, 2008, pending.
   b. U.S. Utility patent application Ser. No. 11/700,285, entitled "RF Bus Controller,", filed Jan. 31, 2007, now issued as U.S. Pat. No. 8,116,294 on Feb. 14, 2012.
   c. U.S. Utility patent application Ser. No. 11/888,068, entitled "Flash Memory with Millimeter Wave Host Interface and Method for Use Therewith," filed Jul. 31, 2007, now issued as U.S. Pat. No. 8,010,735 on Aug. 30, 2011.

STATEMENT REGARDING FEDERALLY SPONSORED RESEARCH OR DEVELOPMENT

NOT APPLICABLE

INCORPORATION-BY-REFERENCE OF MATERIAL SUBMITTED ON A COMPACT DISC

NOT APPLICABLE

BACKGROUND OF THE INVENTION

1. Technical Field of the Invention

This invention relates generally to computing devices and more particularly to components of such computing devices.

2. Description of Related Art

Communication systems are known to support wireless and wire lined communications between wireless and/or wire lined communication devices. Such communication systems range from national and/or international cellular telephone systems to the Internet to point-to-point in-home wireless or wired networks. The wireless and/or wire lined communication devices may be personal computers, laptop computers, personal digital assistants (PDA), cellular telephones, personal digital video players, personal digital audio players, global positioning system (GPS) receivers, video game consoles, entertainment devices, etc.

Many of the communication devices include a similar basic architecture: that being a processing core, memory, and peripheral devices. The memory stores operating instructions that the processing core uses to generate data, which may also be stored in the memory. The peripheral devices allow a user of the communication device to direct the processing core as to which programs and hence which operating instructions to execute, to enter data, etc. and to see the resulting data. For example, a cellular telephone includes a keypad, a display, a microphone and a speaker for such functions.

The memory typically includes a hierarchy structure of cache memory, random access memory (RAM), hard disk memory, and/or flash memory since the processing core operates at a much faster rate than data can be read from, or written to, RAM, hard disks, and/or flash memory. In such a hierarchy structure, the cache memory exchanges data and/or instructions with the processing core and the RAM and the RAM exchanges the data and/or instructions with the hard disk memory and/or flash memory. Such data exchange is typically done in a serial read-write manner. To improve the data exchange, some memories may utilize a double data rate technique. While a great many advances have been made in memory technology, once the architecture of a memory device is implemented on an IC, there is little ability to reconfigure the architecture.

In addition, as integrated circuit technology advances, the basic architecture of random access memory is increasing in complexity, capabilities, and size reduction. However, communication with and/or within such memory is done using traces (e.g., on an IC and/or on a PCB), which requires drivers to drive the lines. As is known, the transferring of data via the traces and drivers consumes a significant amount of power, which produces heat, and consumes a relatively significant amount of die area.

Therefore, a need exists for a configurable memory that reduces power consumption, reduces die area, and/or provides flexibility in implementation.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWING(S)

FIG. 15 is a diagram of an example of wireless communication resources in accordance with the present invention;

FIG. 16 is a diagram of an example of allocating wireless communication resources in accordance with the present invention;

DETAILED DESCRIPTION OF THE INVENTION

Figure 1:
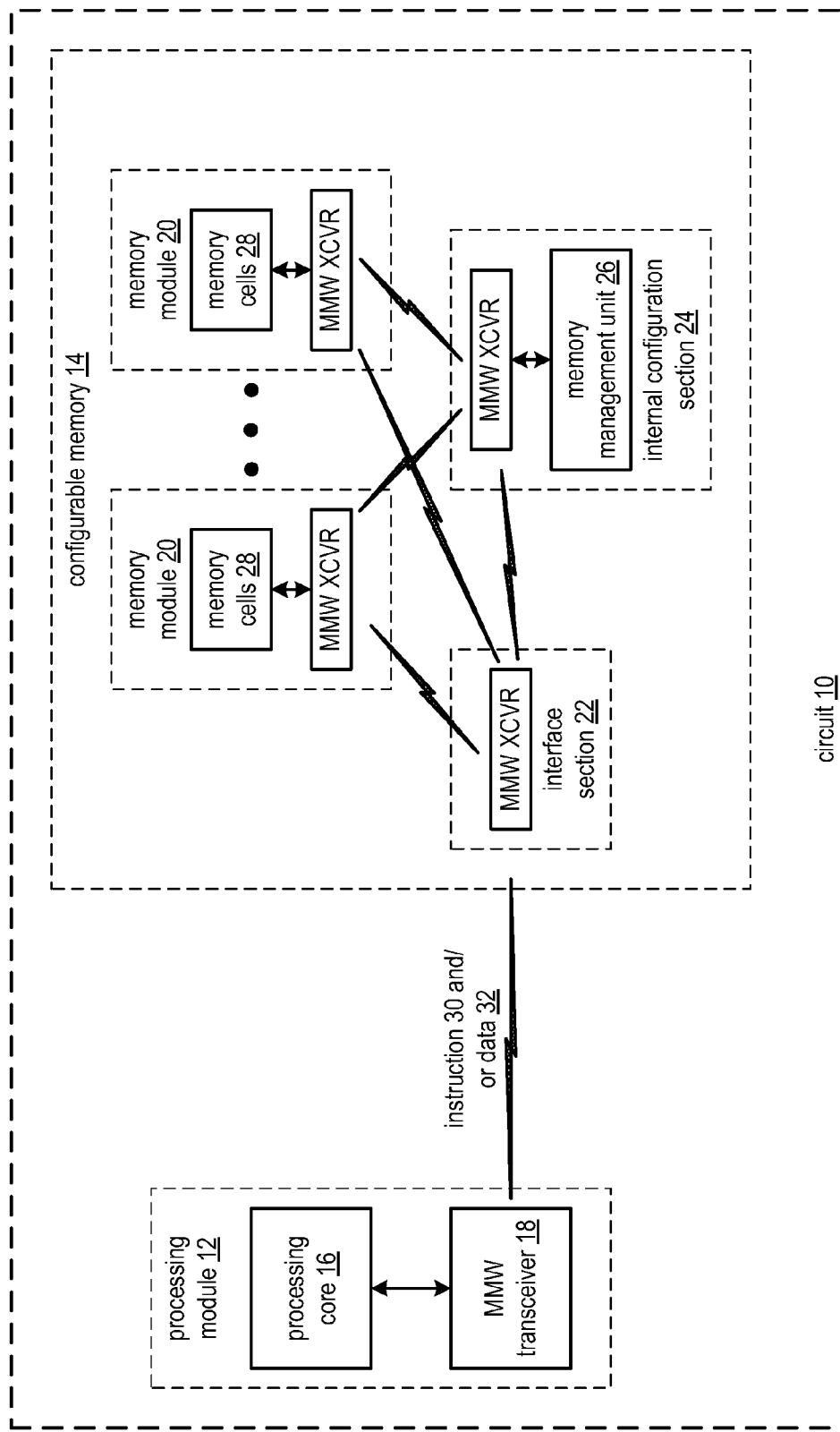
FIG. 1 is a schematic block diagram of an embodiment of a circuit in accordance with the present invention.

FIG. 1 is a schematic block diagram of an embodiment of a circuit 10 that includes a processing module 12 and configurable memory 14. The circuit 10 may be implemented as single integrated circuit (IC) including the processing module 12 and the configurable memory 14. Alternatively, the circuit may be implemented as two ICs: one for the processing module 12 and another for the configurable memory 14.

The processing module 12 includes a processing core 16 and a millimeter wave (MMW) transceiver 18. The processing core 16 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions.

The configurable memory 14 includes a plurality of memory modules 20, an interface section 22, and an internal configuration section 24. Each of the memory modules 20 includes a plurality of memory cells 28 and a MMW transceiver (MMW XCVR). The interface section 22 includes at least one MMW transceiver. The internal configuration section 24 includes a memory management unit 26 and at least one MMW transceiver.

Each of the MMW transceivers 18 and the plurality within the configurable memory 14 includes a baseband processing module, a receiver section, and a transmitter section. The transmitter and receiver sections may share one or more antennas or each may have its own one or more antennas. The baseband processing module converts outbound data (e.g., an instruction 30 and/or data 32) into an outbound symbol stream in accordance with a data modulation scheme and a channel usage scheme. The data modulation scheme may be binary phase shift keying (BPSK), quadrature phase shift keying (QPSK), frequency shift keying (FSK), minimum shift keying (MSK), amplitude shift keying (ASK), quadrature amplitude modulation (QAM), a combination thereof, and/or variations thereof. The channel usage scheme may be time division multiple access (TDMA), frequency divisional multiple access (FDMA), code division multiple access (CDMA), orthogonal frequency division multiplexing (OFDM), a combination thereof, and/or variations thereof. In addition, the baseband processing module may also utilize a scrambling scheme, an encoding scheme, a data puncture scheme, an interleaving scheme, space-time-frequency encoding, a beamforming scheme, a frequency to time domain conversion, and/or a combination thereof to produce the outbound symbol stream.

The transmitter section converts the outbound symbol stream into an outbound RF signal that has a carrier frequency within a given frequency band (e.g., 57-66 GHz, etc.). In an embodiment, this may be done by mixing the outbound symbol stream with a local oscillation to produce an up-converted signal. One or more power amplifiers and/or power amplifier drivers amplifies the up-converted signal, which may be RF bandpass filtered, to produce the outbound RF signal. In another embodiment, the transmitter section includes an oscillator that produces an oscillation. The outbound symbol stream provides phase information (e.g., +/− $\Delta\theta$ [phase shift] and/or $\theta(t)$ [phase modulation]) that adjusts the phase of the oscillation to produce a phase adjusted RF signal, which is transmitted as the outbound RF signal. In another embodiment, the outbound symbol stream includes amplitude information (e.g., $A(t)$ [amplitude modulation]), which is used to adjust the amplitude of the phase adjusted RF signal to produce the outbound RF signal.

In yet another embodiment, the transmitter section includes an oscillator that produces an oscillation. The outbound symbol provides frequency information (e.g., +/− $\Delta f$ [frequency shift] and/or $f(t)$ [frequency modulation]) that adjusts the frequency of the oscillation to produce a frequency adjusted RF signal, which is transmitted as the outbound RF signal. In another embodiment, the outbound symbol stream includes amplitude information, which is used to adjust the amplitude of the frequency adjusted RF signal to produce the outbound RF signal. In a further embodiment, the transmitter section includes an oscillator that produces an oscillation. The outbound symbol provides amplitude information (e.g., +/− $\Delta A$ [amplitude shift] and/or $A(t)$ [amplitude modulation]) that adjusts the amplitude of the oscillation to produce the outbound RF signal.

The receiver section amplifies an inbound RF signal to produce an amplified inbound RF signal. The receiver section may then mix in-phase (I) and quadrature (Q) components of the amplified inbound RF signal with in-phase and quadrature components of a local oscillation to produce a mixed I signal and a mixed Q signal. The mixed I and Q signals are combined to produce an inbound symbol stream. In this embodiment, the inbound symbol may include phase information (e.g., +/− $\Delta\theta$ [phase shift] and/or $\theta(t)$ [phase modulation]) and/or frequency information (e.g., +/− $\Delta f$ [frequency shift] and/or $f(t)$ [frequency modulation]). In another embodiment and/or in furtherance of the preceding embodiment, the inbound RF signal includes amplitude information (e.g., +/− $\Delta A$ [amplitude shift] and/or $A(t)$ [amplitude modulation]). To recover the amplitude information, the receiver section includes an amplitude detector such as an envelope detector, a low pass filter, etc.

The baseband processing module converts the inbound symbol stream into inbound data (e.g., the instruction 30 and/or data 32) in accordance with the data modulation scheme and the channel usage scheme. In addition to demodulating the inbound symbol stream, the baseband processing module may also utilize a descrambling scheme, a decoding scheme, a data de-puncture scheme, a de-interleaving scheme, space-time-frequency decoding, a time to frequency domain conversion, and/or a combination thereof to produce the inbound data.

In operation, the processing core 16 and the configurable memory 14 exchange an instruction 30 and/or data 32 via the MMW transceiver 18 and the MMW transceiver of the interface section 22. Within the configurable memory 14, the instruction 30 and/or data 32 is conveyed via one or more wireless communication resources (e.g., a channel, division multiple access slot, etc.) between the MMW transceiver of the interface section 22 and the MMW transceivers of the appropriate memory modules 20. Note that the instruction 30 (which may include a plurality of instructions (e.g., a page or more of instructions)) and the data 32 (which may include a plurality of data elements (e.g., a page or more of data)) are stored in one or more memory modules 20 as configured by the internal configuration section 24.

The instruction 30 may be one of a plurality of operation codes, one or a plurality of assembly language codes, one of a software instruction set, one of a plurality of machine codes, etc. Each instruction 30 may have one or more operands (e.g., data 32) associated therewith, which may be representative of data being manipulated in accordance with the instruction (e.g., write XX to an address of memory), a register vale, a value in a stack, an input/output port, or other piece of information.

As an example of operation, assume that the processing core 16 is executing an algorithm that includes a plurality of instructions 30 and data 32, which are stored in the configurable memory 14. To retrieve an instruction 30 and/or data 32 from the configurable memory 14, the processing core 16 executes a fetch instruction, which identifies the instruction 30 and/or data 32. The MMW transcevier 18 converts the fetch instruction into an outbound RF signal that is received as an inbound RF signal by the MMW transceiver of the interface section 22. The MMW transcevier of the interface section 22 converts the inbound RF signal into inbound data (e.g., the fetch instruction), which it interprets to identify the appropriate memory modules 20.

The MMW transceiver of the interface section 22 generates an internal RF signal from the recovered fetch instruction and transmits it via allocated communicated wireless communication resources of the targeted memory modules 20. The MMW transceivers of the targeted memory modules 20 receive the internal RF signal and recapture the fetch instruction or partitioned fetch instruction (e.g., the MMW transceiver of the interface section 22 may have partitioned the fetch instruction for each memory module 20). Based on the recovered fetch instruction, or partitioned fetch instruction, the MMW transceiver addresses the plurality of memory cells 28 to read and/or write the instruction and/or data. Note that each memory module 20 may includes a few memory cells 28 (e.g., 16-4K) to a relatively large number of memory cells (e.g., 4K or more).

The addressed plurality of memory cells 28 reads and/or stores the instruction 30 and/or data 32. For a read operation, the plurality of memory cells 28 provides the retrieved instruction and/or data to the associated MMW transceiver. The associated MMW transceiver converts the retrieved instruction and/or data into an outbound RF signal that is transmitted via the allocated wireless communication resource to the MMW transceiver of the interface section 22. If the requested instruction and/or data was stored in more than one memory module 20, the MMW transceiver of the interface section 22, combines the partial instruction and/or data received from the multiple memory modules 20. The MMW transceiver of the interface section 22 then converts the combined instruction and/or data into an outbound RF signal that is transmitted to the MMW transceiver 18, which is received as an inbound RF signal by the MMW transceiver 18.

The MMW transcevier 18 converts the inbound RF signal into inbound data (e.g., the retrieved instruction 30 and/or data 32) and provides it to the processing core 16. In this manner, instructions 30 and/or data 32 are exchanged via an RF bus structure, which has a carrier frequency in the millimeter wave (MMW) range of 3 GHz to 300 GHz. For a more detailed discussion on an RF bus structure refer to co-pending patent application entitled RF BUS CONTROLLER, having a filing date of Jan. 31, 2007, and a serial number of Ser. No. 11/700,285.

As an alternative to RF based transceivers, the transceivers 18 and 22 may be magnetic based. For a discussion of magnetic based transceivers refer to co-pending patent application entitled INDUCTIVELY COUPLED INTEGRATED CIRCUIT AND METHODS FOR USE THEREWITH, having a filing date of Feb. 27, 2008, and a serial number of Ser. No. 12/038,260.

In an alternate embodiment, the configurable memory 14 may omit the interface section 22. In this instance, the MMW transceivers of memory modules 20 receive the RF signal that includes fetch instruction from the MMW transceiver 18. The MMW transceivers of the memory modules process the received RF signal to determine whether it is associated with the plurality of memory cells 28 storing at least a portion of the requested instruction and/or data. If not, the MMW transceiver ignores the fetch instruction. If, however, the MMW transceiver is associated with the plurality of memory cells storing at least a portion of the requested instruction and/or data, the MMW transceiver provides the fetch instruction, or relevant portion thereof, to the plurality of memory cells 28.

The addressed plurality of memory cells 28 reads and/or stores the instruction 30 and/or data 32. For a read operation, the plurality of memory cells 28 provides the retrieved instruction and/or data to the associated MMW transceiver. The associated MMW transceiver converts the retrieved instruction and/or data into an outbound RF signal that is transmitted to the MMW transceiver 18, which is received as an inbound RF signal by the MMW transceiver 18.

Figure 2:
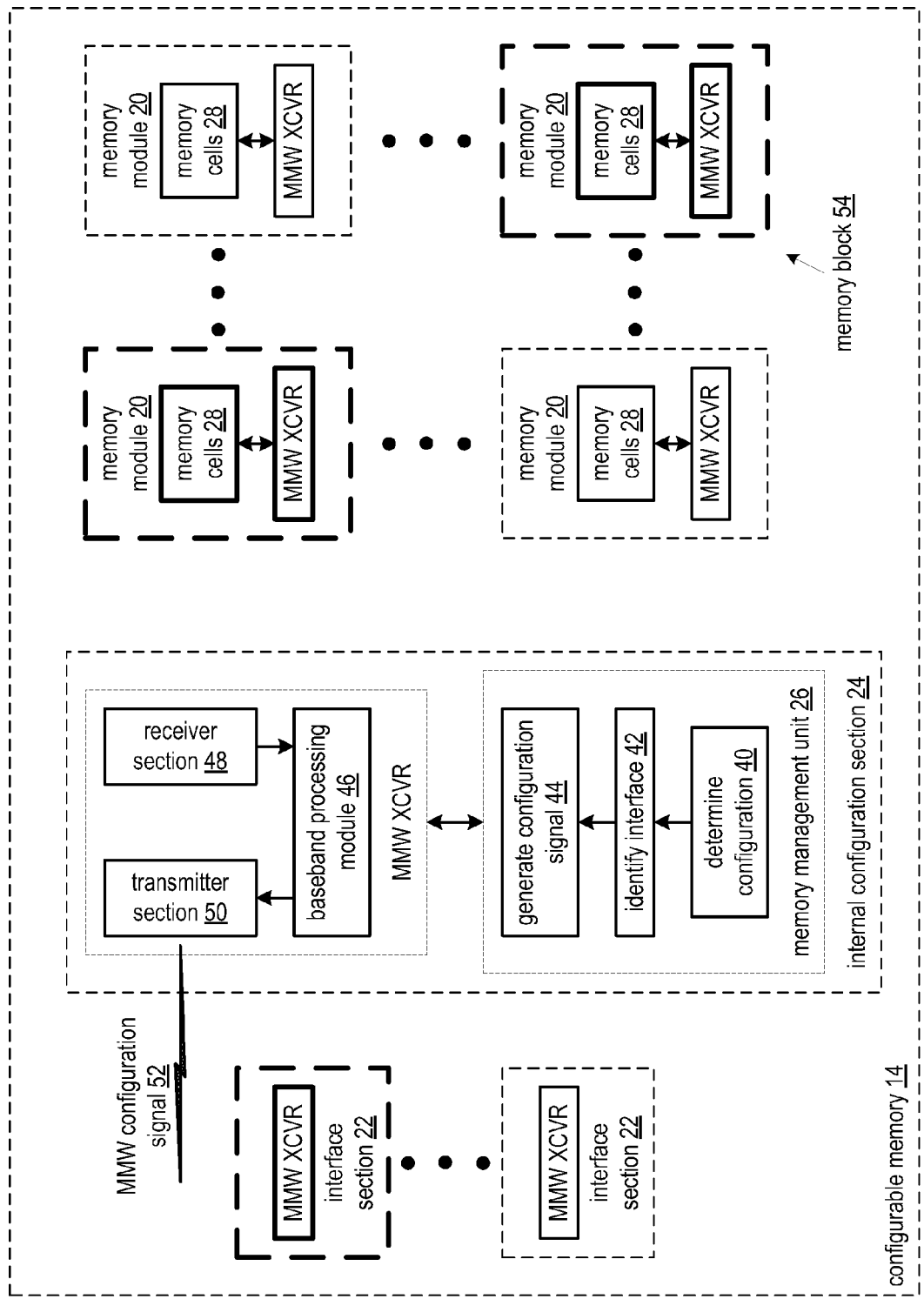
FIG. 2 is a schematic block diagram of an embodiment of a configurable memory in accordance with the present invention.

FIG. 2 is a schematic block diagram of an embodiment of a configurable memory 14 that includes a plurality of interface sections 22, the internal configuration section 24, and the plurality of memory modules 20. The internal configuration section 24 includes a memory management unit 26 and a MMW transceiver. The MMW transceiver of the internal configuration section 24 is representative of the other MMW transceivers and includes a baseband processing module 46, a receiver section 48, and a transmitter section 50. The baseband processing module 46, the receiver section 48, and the transmitter section 50 function as previously described and may further function as subsequently described.

The memory management unit 26 includes one or more processing devices to perform one more memory management functions. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions.

The memory management functions include conventional memory management operations and additional operations as described herein. The conventional memory management operations include, but are not limited to, virtual memory management, disk swapping, garbage collection (e.g., automatic allocation and deallocation of memory), relocation (e.g., relocate programs in memory), memory protection, memory sharing, logical organization including segmentation, physical organization, and/or memory compaction.

In an embodiment, the memory management unit 26 determine configuration of at least some of the plurality of memory modules 20 to form a memory block 54. For example, if the circuit 10 of FIG. 1 is executing a program, one or more memory blocks 54 may be needed to support the execution of the program. For instance, one or more memory blocks 54 may be configured to store instructions and one or more other memory blocks 54 may be configured to store data.

The memory management unit 26 also identifies an interface MMW transceiver (i.e., a MMW transceiver of an interface section 22) to support the one or more memory blocks 54. As an alternative, if multiple memory blocks 54 are configured, the memory management unit 26 may identify an interface MMW transceiver for each of the memory blocks 54 such that each memory block 54 has its own interface MMW transceiver or shares one with a few other memory blocks 54.

The memory management unit 26 then generates a configuration signal based on the determined configuration and the identified interface MMW transceiver. The MMW transceiver of the internal configuration module 24 converts the configuration signal into a MMW configuration signal 52. The MMW transceiver transmits the MMW configuration signal 52 to the MMW transceivers of the interface sections 22 and to the MMW transceivers of the memory modules 20. The MMW transceiver may transmit the MMW configuration signal 52 using one or more communication resources to the interface sections and another one or more communication resources to the memory modules 20. Alternatively, the MMW configuration signal 52 may be transmitted via the same one or more communication resources to the MMW transceivers of the interface section and the memory modules 20.

In the diagram of FIG. 2, the interface section 22 with the bold lines has been selected to support the memory block 54 of the memory modules 20 with the bold lines. In addition, the configuration signal 52 indicates the wireless communication resource(s) that the interface MMW transceiver will use to communicate with an external device and further indicates the communication resource(s) that the MMW transceivers of the memory module will use to communicate with the interface MMW transceiver.

The configurable memory 14 may be implemented on one or more integrated circuits. For instance, the plurality of interface sections 22, the internal configuration module 24, and the plurality of memory modules 20 may be on the same IC. Alternatively, the memory modules 20 may be on multiple ICs, at least one interface section 22 on each IC, and the internal configuration section 24 on at least one of the ICs.

Figure 3:
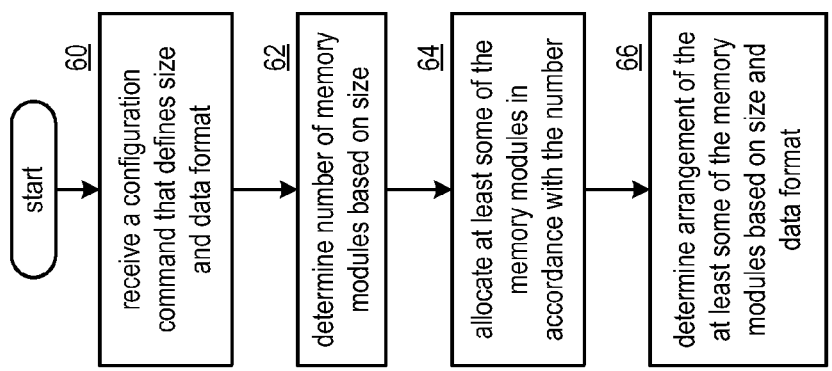
FIG. 3 is a logic diagram of an embodiment of a method for configuring memory in accordance with the present invention.

FIG. 3 is a logic diagram of an embodiment of a method for configuring memory that begins at step 60 wherein the memory management unit 26 receives a configuration command that defines size and data format of the memory block 54. The command may be received from the processing module 12 or from another external device. As an alternative to receiving a configuration command, the memory management unit 26 may use a default configuration scheme to define the size and data format of a memory block.

The method continues at step 62 where the memory management unit 26 determines a number of memory modules 20 based on the size. For example, if each memory module 20 includes 512 bytes of storage and the memory size requested is 512K, then 1000 memory modules would be needed. The method continues at step 64 where the memory management unit 26 allocates at least some of the plurality of memory modules 20 in accordance with the number of memory modules. Continuing with the preceding example, 1000 memory modules 20 would be allocated for the memory block.

The method then continues at step 66 where the memory management unit 26 determines arrangement of at least some of the plurality of memory modules based on the size and the data format. For example, if the data format is a double word format and each word is 32 bits, then the memory modules 20 would be arranged to provide the double word format (e.g., 64 bits per address) and to accommodate the requested memory size. Continuing with the preceding example, each memory module 20 would include 64 addressable memory lines of 64 bits per line and the memory modules would be virtually linked to create the 512 K bytes of memory.

Figure 4:
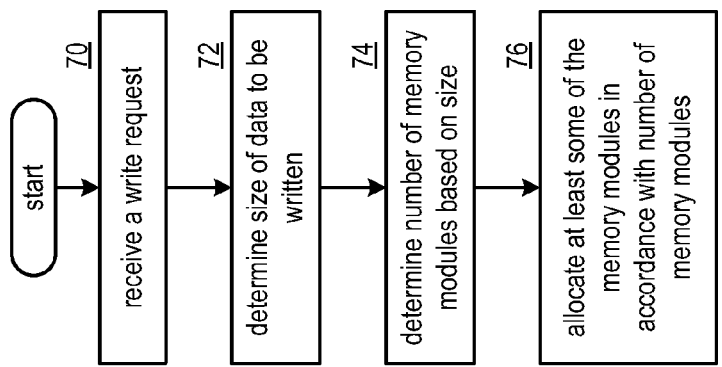
FIG. 4 is a logic diagram of another embodiment of a method for configuring memory in accordance with the present invention.

FIG. 4 is a logic diagram of another embodiment of a method for configuring memory that begins at step 70 where the memory management unit 26 receives a write request. For example, the processing core 16 may generate a write instruction that is converted to a MMW signal by the MMW transceiver 18. An assigned interface section 22 receives the MMW signal and recaptures the write instruction. The assigned interface section 22 interprets the write instruction to determine whether a memory block has been created. If yes, the assigned interface section 22 wirelessly forwards the write instruction to the memory modules 20 comprising the memory block 54. If, however, a memory block has not been created, the assigned interface section 22 wirelessly forwards the write instruction to the internal configuration section 24.

Alternatively, the MMW transceiver of the internal configuration section 24 receives the MMW signal and recaptures the write instruction and provides it to the memory management unit 26. The memory management unit 26 interprets the write instruction to determine whether a memory block has been created. If, yes, the memory modules 20 comprising the memory block receive the write instruction via the MMW signal. If a memory block has not been created, then the method continues at step 72 where the memory management unit 26 determines size of the data to be written based on the write request, or instruction.

The method continues at step 74 where the memory management unit 26 determines a number of memory modules 20 based on the size of data. For an example, refer to the one provided with reference to FIG. 3. The method continues at step 76 where the memory management unit 26 allocates the at least some of the plurality of memory modules 26 in accordance with the number of memory modules. The memory management unit 26 maintains a memory block allocation map to track the allocation of memory modules to a memory block, the virtual (and/or physical) addresses of the memory modules within the memory block, interface section allocations, wireless communication resource allocation for external device interfacing, and wireless communication resource allocation for internal communication. An example of a memory block allocation map will be described in greater detail with reference to FIG. 16.

Figure 5:
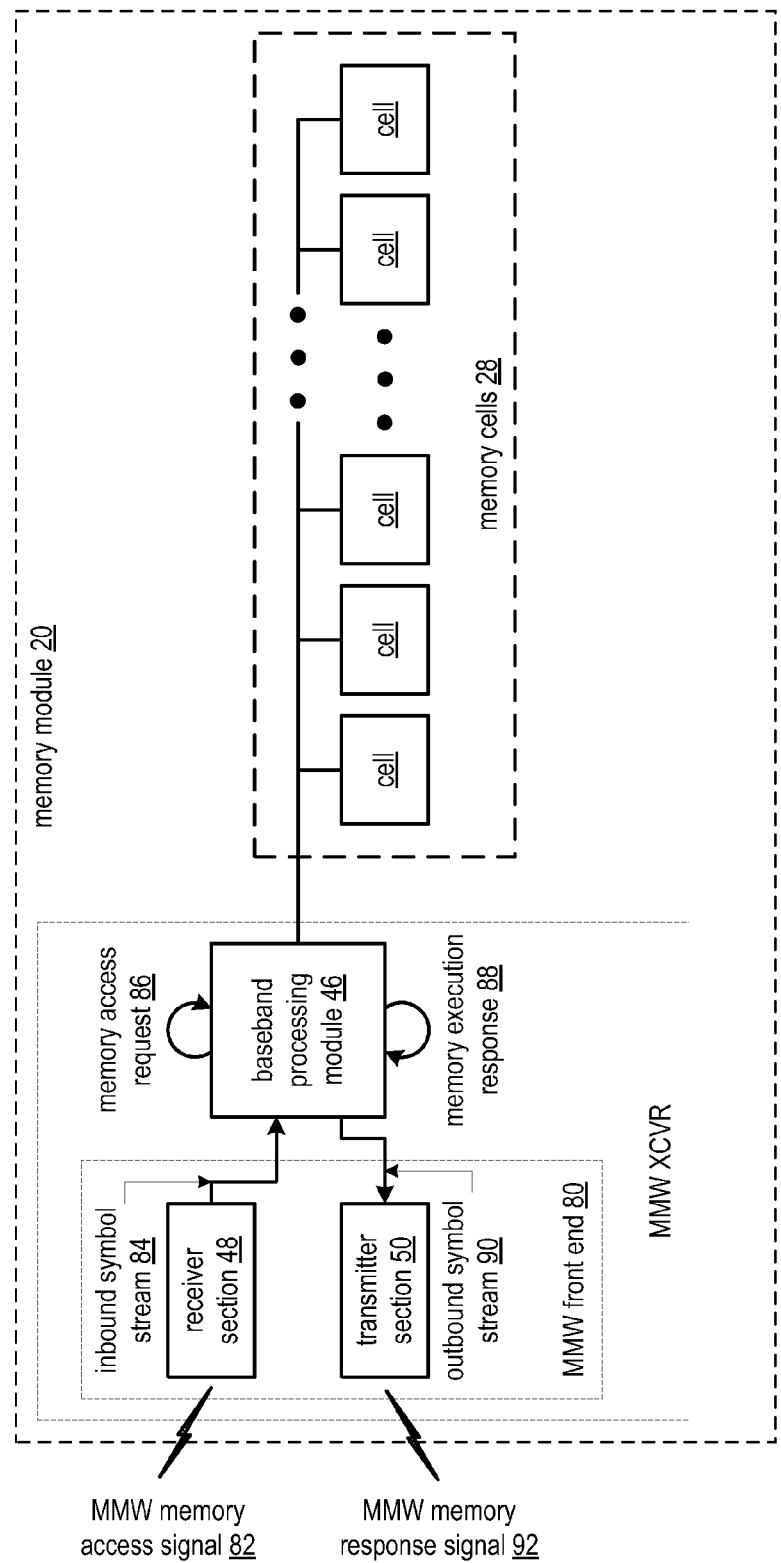
FIG. 5 is a schematic block diagram of an embodiment of a memory module in accordance with the present invention.

FIG. 5 is a schematic block diagram of an embodiment of a memory module 20 that includes the MMW transceiver and a plurality of memory cells 28, which is arranged in a row of a given number of cells (e.g., $2^4$ to $2^{12}$ or more). Each memory cell includes circuitry to store a bit of data. The circuitry may be a flip-flop (e.g., for static RAM), a capacitor and/or transistor (e.g., for dynamic RAM), etc. The circuitry may also include parity bit checking and/or error correction coding functionality to detect and/or correct memory errors.

The memory MMW transceiver includes the baseband processing module 46 and a MMW front end 80 that includes the receiver section 48 and the transmitter section 50.

In operation, the receiver section 48 receives a MMW memory access signal 82 from an allocated interface MMW transceiver. The MMW memory access signal 82 may includes a read instruction, a write instruction, and/or memory access request instruction. The receiver section 48 converts the MMW memory access signal 82 into a baseband or near baseband inbound symbol stream 84.

The baseband processing module 46 recovers the memory access request 86 from the baseband or near baseband inbound symbol stream 48 and coordinates execution of the memory access request with the plurality of memory cells 28. For example, if the request 86 is a read instruction, the baseband processing module 46 retrieves the data stored in plurality of memory cells 28, which may be done in a serial manner, parallel manner, or combination thereof. In an embodiment, the baseband processing module 26 is coupled to the plurality of cells 28 via a plurality of bit lines.

The baseband processing module 46 further functions to generate a memory execution response 88 when required. For example, when the request 86 is a read request, the data retrieved from the memory cells 28 is the memory execution response. In this instance, the baseband processing module 46 converts the memory execution response 88 into the baseband or near baseband outbound symbol stream 90.

The transmitter section 50 converts the baseband or near baseband outbound symbol stream 90 into a MMW memory response signal 92 and transmits it to the interface MMW transceiver. The interface MMW transceiver forwards the MMW memory response signal 92 to the requesting external device (e.g., the processing module 12). Note that the interface MMW transceiver may function as a MMW repeater for relaying the MMW memory response signal 92 (i.e., just forwards it without changing the carrier frequency). Alternatively, the interface MMW transceiver processes the signal 92 to recapture the baseband symbol stream and MMW modulate the baseband symbol stream to produce a new MMW memory response signal at a different carrier frequency than that of the signal 92.

Figure 6:
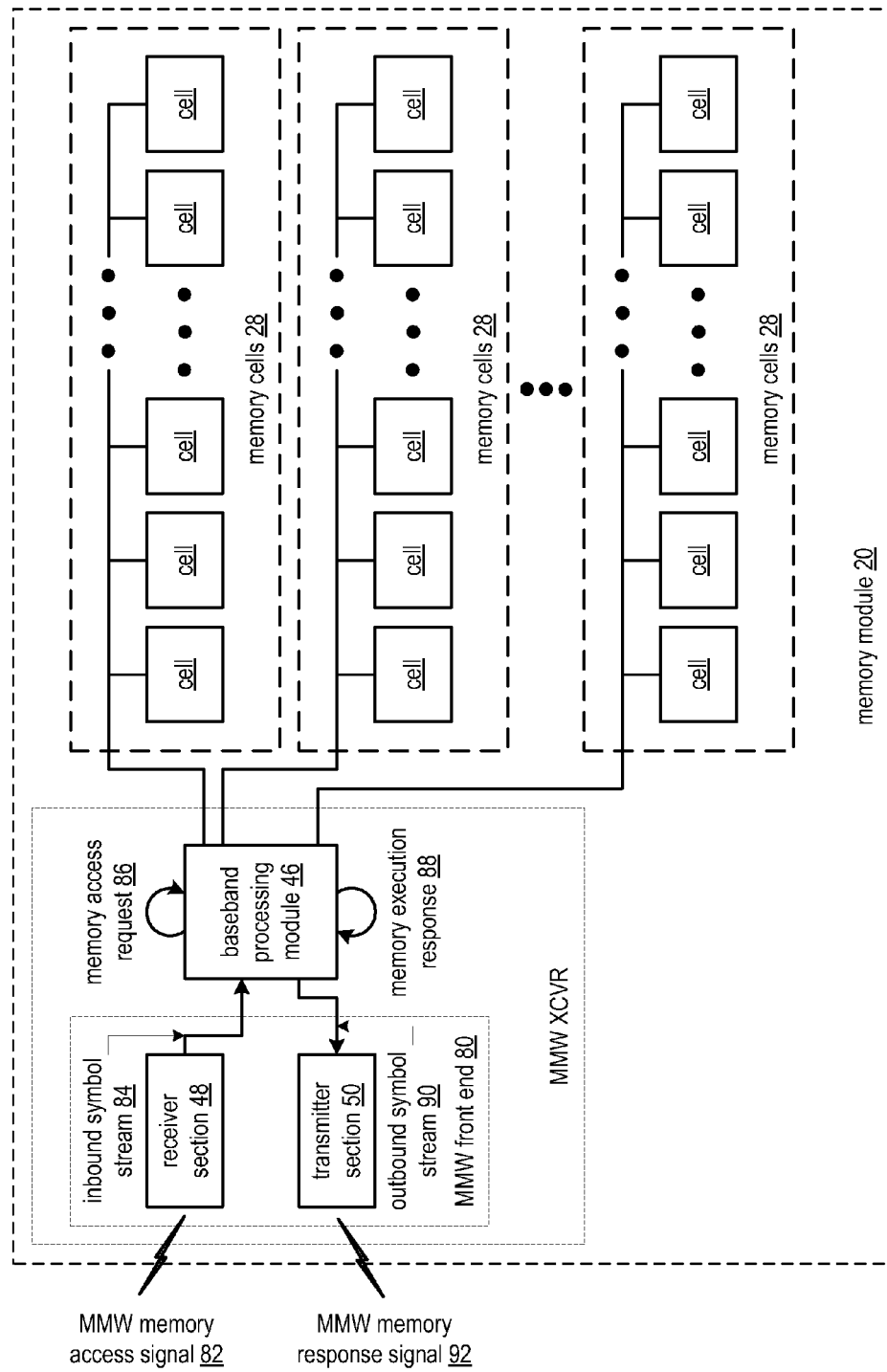
FIG. 6 is a schematic block diagram of another embodiment of a memory module in accordance with the present invention.

FIG. 6 is a schematic block diagram of another embodiment of a memory module 20 that includes the MMW transceiver and a plurality of memory cells 28. In this embodiment, the plurality of memory cells 20 is arranged in a plurality of rows, where each row is coupled to the baseband processing module 46 and includes a given number of cells (e.g., $2^4$ to $2^{12}$ or more).

The memory MMW transceiver includes the baseband processing module 46 and a MMW front end 80 that includes the receiver section 48 and the transmitter section 50. In operation, the receiver section 48 receives a MMW memory access signal 82 from an allocated interface MMW transceiver. The baseband processing module 46 recovers the memory access request 86 from the baseband or near baseband inbound symbol stream 84 and coordinates execution of the memory access request with the plurality of memory cells 28. For example, if the request 86 is a read instruction, the baseband processing module 46 determines which row or rows the requested data is stored in and retrieves the data from the row or rows. In an embodiment, the baseband processing module 26 is coupled to each row via a plurality of bit lines.

The baseband processing module 46 further functions to generate a memory execution response 88 when required. The baseband processing module 46 converts the memory execution response 88 into the baseband or near baseband outbound symbol stream 90. The transmitter section 50 converts the baseband or near baseband outbound symbol stream 90 into a MMW memory response signal 92 and transmits it to the interface MMW transceiver. The interface MMW transceiver forwards the MMW memory response signal 92 to the requesting external device (e.g., the processing module 12).

Figure 7:
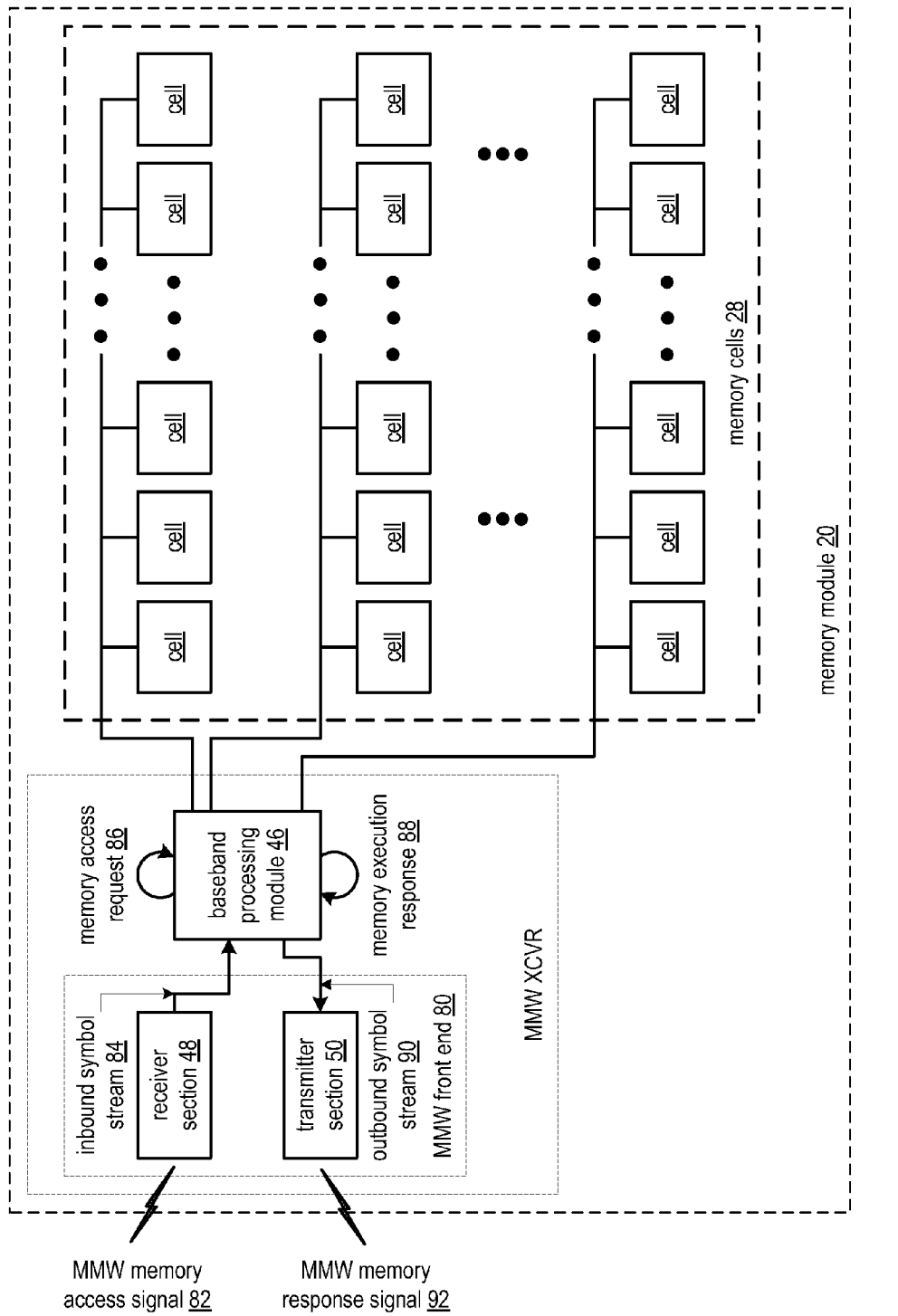
FIG. 7 is a schematic block diagram of another embodiment of a memory module in accordance with the present invention.

FIG. 7 is a schematic block diagram of another embodiment of a memory module 20 that includes the MMW transceiver and a plurality of memory cells 28. In this embodiment, the plurality of memory cells 20 is arranged in an array having rows and columns. The number of cells within the array may range from a very small number (e.g., $2^4$-$2^8$) or to a larger number (e.g., $2^{12}$ or more).

The memory MMW transceiver includes the baseband processing module 46 and a MMW front end 80 that includes the receiver section 48 and the transmitter section 50. In operation, the receiver section 48 receives a MMW memory access signal 82 from an allocated interface MMW transceiver. The baseband processing module 46 recovers the memory access request 86 from the baseband or near baseband inbound symbol stream 84 and coordinates execution of the memory access request with the plurality of memory cells 28. For example, if the request 86 is a read instruction, the baseband processing module 46 determines which row or rows the requested data is stored in and retrieves the data from the row or rows. In an embodiment, the baseband processing module 26 is coupled to the array via a plurality of bit lines and a plurality of word lines.

The baseband processing module 46 further functions to generate a memory execution response 88 when required. The baseband processing module 46 converts the memory execution response 88 into the baseband or near baseband outbound symbol stream 90. The transmitter section 50 converts the baseband or near baseband outbound symbol stream 90 into a MMW memory response signal 92 and transmits it to the interface MMW transceiver. The interface MMW transceiver forwards the MMW memory response signal 92 to the requesting external device (e.g., the processing module 12).

Figure 8:
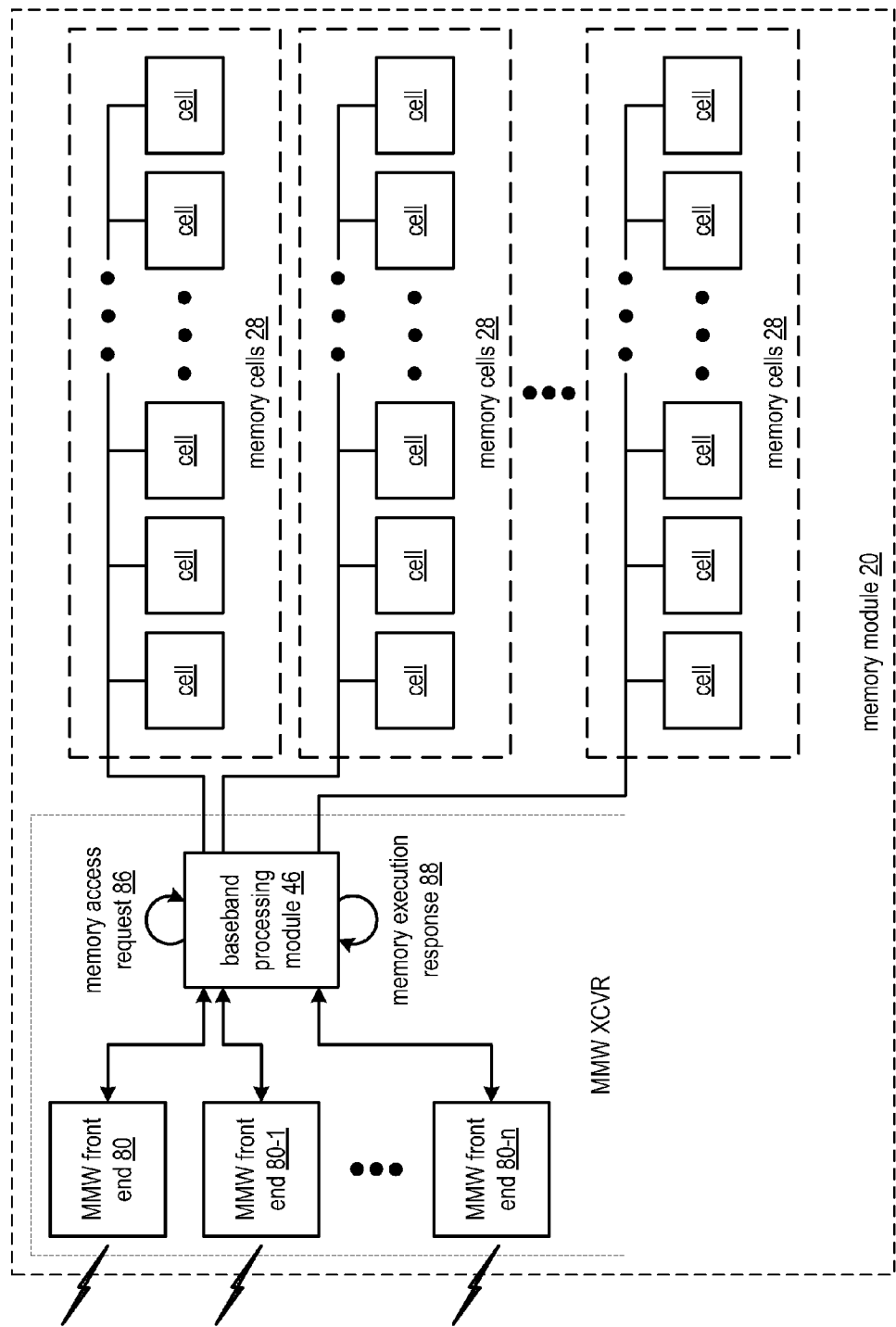
FIG. 8 is a schematic block diagram of another embodiment of a memory module in accordance with the present invention.

FIG. 8 is a schematic block diagram of another embodiment of a memory module 20 that includes the MMW transceiver and a plurality of memory cells 28. In this embodiment, the plurality of memory cells 20 is arranged in a plurality of rows, where each row is coupled to the baseband processing module 46 and includes a given number of cells (e.g., $2^4$ to $2^{12}$ or more). Alternatively, the plurality of memory cells may be arranged as a plurality of arrays.

The MMW transceiver includes the baseband processing module 48 and a plurality of MMW front-ends 80 through 80-n, wherein the number of MMW front-ends corresponds to the number of rows of memory cells. To access a given row, or rows, the receiver section of the corresponding MMW front-end(s) receives a MMW memory access signal from an allocated interface MMW transceiver. In this embodiment, each MMW front-end may be allocated a unique wireless communication resource, which the interface section 22 utilizes to provide the MMW memory access signal to the appropriate MMW front-end(s). The receiver section(s) converts the MMW memory access signal into a memory access request.

The baseband processing module 46 recovers the memory access request 86 from the baseband or near baseband inbound symbol stream and coordinates execution of the memory access request with the corresponding row or rows.

For example, if the request 86 is a read instruction, the baseband processing module 46 determines which row or rows the requested data is stored in based on which front-end(s) providing the symbol stream and retrieves the data from the row or rows. In an embodiment, the baseband processing module 26 is coupled to each row via a plurality of bit lines.

The baseband processing module 46 further functions to generate a memory execution response 88 when required. The baseband processing module 46 converts the memory execution response 88 into the baseband or near baseband outbound symbol stream 90. The transmitter section 50 of the corresponding MMW front-end(s) converts the baseband or near baseband outbound symbol stream into a MMW memory response signal 92 and transmits it to the interface MMW transceiver. The interface MMW transceiver forwards the MMW memory response signal to the requesting external device (e.g., the processing module 12).

Figure 9:
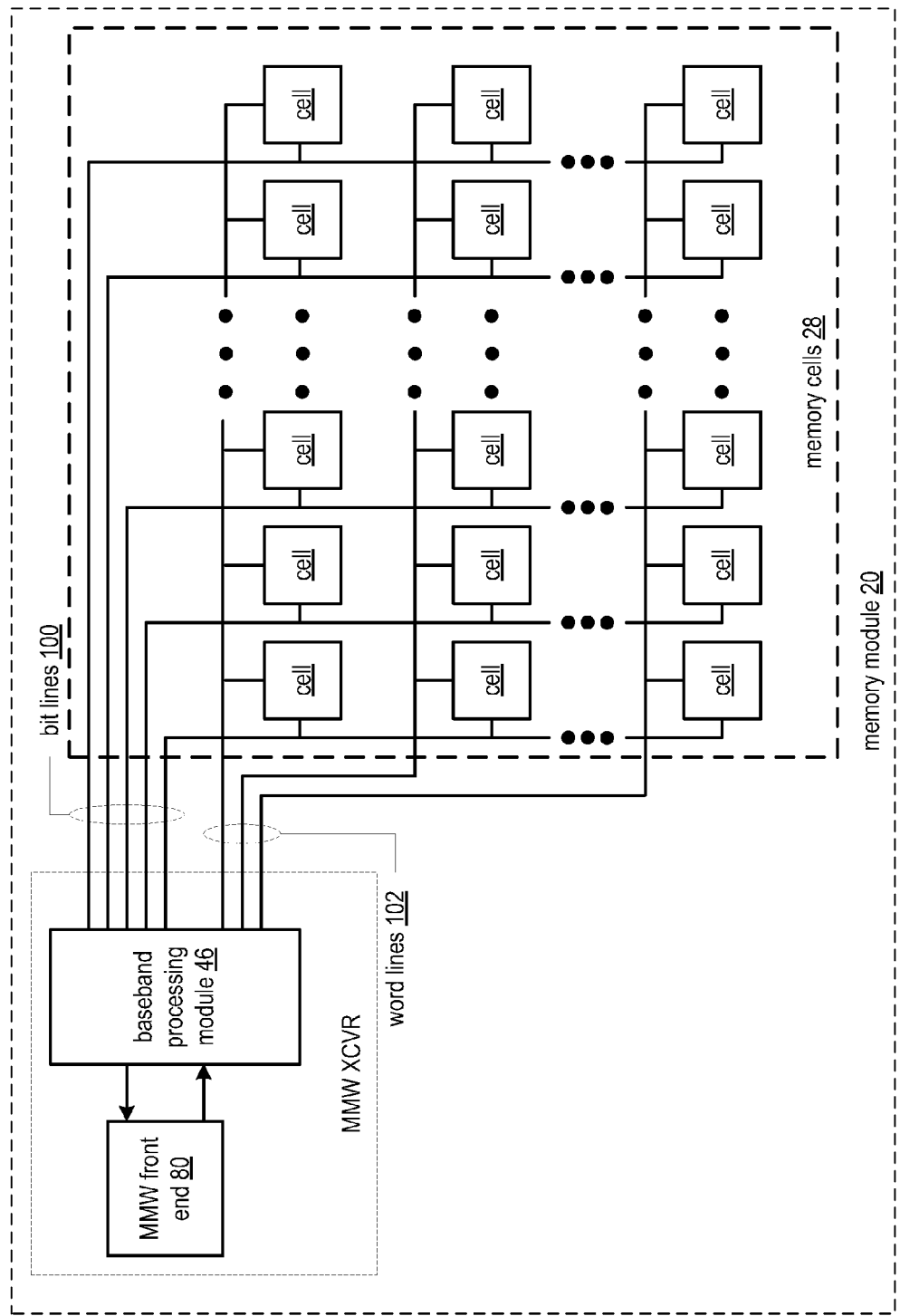
FIG. 9 is a schematic block diagram of another embodiment of a memory module in accordance with the present invention.

FIG. 9 is a schematic block diagram of another embodiment of a memory module 20 that includes the MMW transceiver and a plurality of memory cells 28. In this embodiment, the plurality of memory cells 20 is arranged into one or more arrays, where each array includes rows and columns. The number of cells within the array may range from a very small number (e.g., $2^4$-$2^8$) or to a larger number (e.g., $2^{12}$ or more). The memory MMW transceiver includes the baseband processing module 46 and a MMW front end 80 that includes the receiver section 48 and the transmitter section 50. The baseband processing module 46 is coupled to the one or more arrays by a plurality of bit lines 100 and a plurality of word lines 102.

In operation, the receiver section 48 receives a MMW memory access signal from an allocated interface MMW transceiver. The baseband processing module 46 recovers the memory access request from the baseband or near baseband inbound symbol stream and coordinates execution of the memory access request with the plurality of memory cells 28. For example, if the request is a read instruction, the baseband processing module 46 determines which row or rows the requested data is stored in and retrieves the data from the row or rows.

As another example, if the memory access request is a memory write request, the baseband processing module functions to recover the memory write request from the baseband or near baseband inbound symbol stream. The baseband processing module 46 then determines a location within the array to store the data based on the memory write request. The baseband processing module 46 then provides the data to the location within the array via corresponding bit lines of the plurality of bit lines 100 and corresponding word lines of the plurality of word lines 102.

The baseband processing module 46 further functions to generate a memory execution response when required (e.g., a read request). The baseband processing module 46 converts the memory execution response into the baseband or near baseband outbound symbol stream 90. The transmitter section 50 converts the baseband or near baseband outbound symbol stream into a MMW memory response signal and transmits it to the interface MMW transceiver. The interface MMW transceiver forwards the MMW memory response signal to the requesting external device (e.g., the processing module 12).

Figure 10:
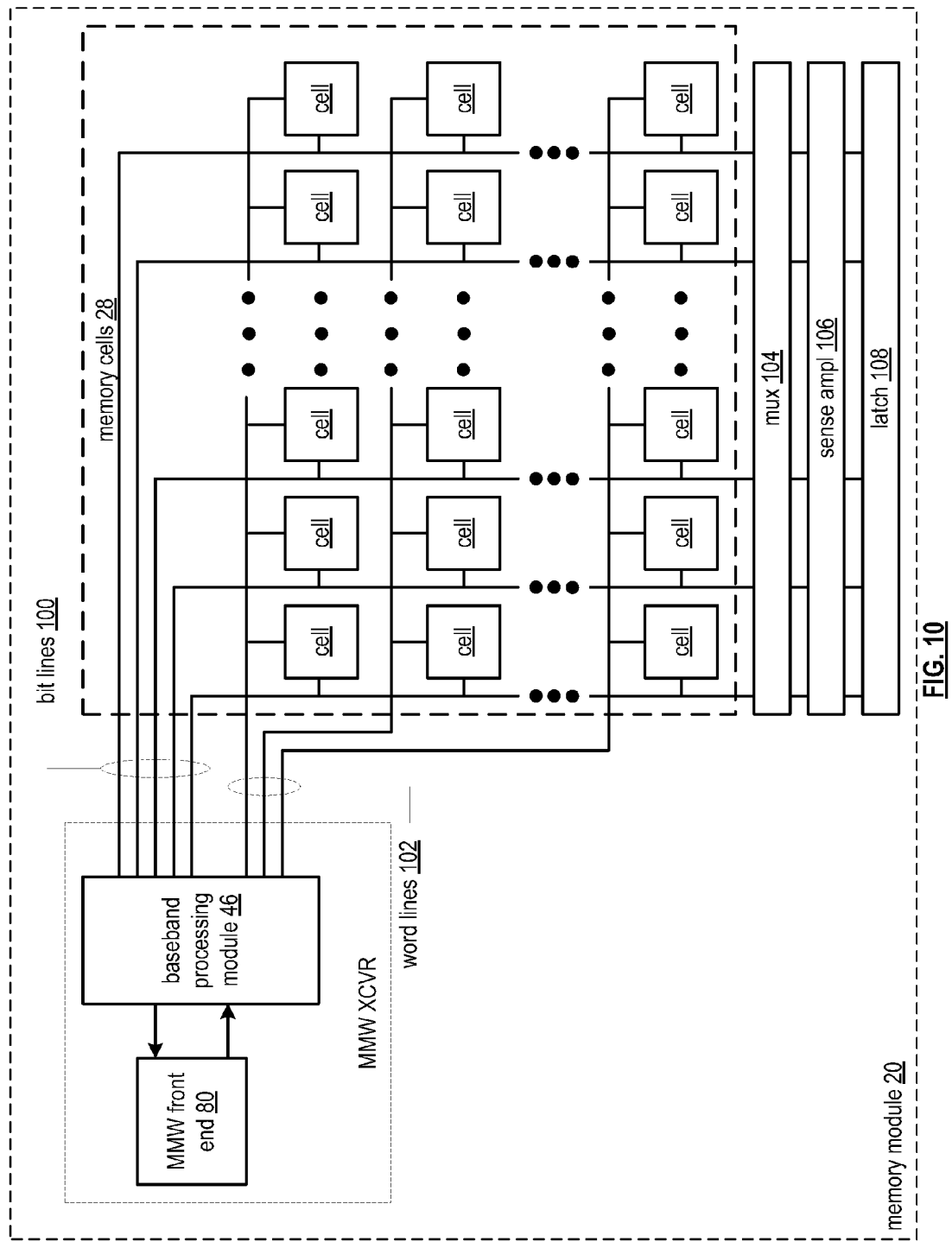
FIG. 10 is a schematic block diagram of another embodiment of a memory module in accordance with the present invention.

FIG. 10 is a schematic block diagram of another embodiment of a memory module 20 that includes the MMW transceiver, a plurality of memory cells 28 arranged in one or more arrays, a multiplexer 104, a sense amplifier 106, and a latch 108. The memory MMW transceiver includes the baseband processing module 46 and a MMW front end 80 that includes the receiver section 48 and the transmitter section 50. The baseband processing module 46 is coupled to the one or more arrays by a plurality of bit lines 100 and a plurality of word lines 102. Note that the multiplexer 104, the sense amplifier 106, and the latch 108 may be implemented within the baseband processing module 46, within the array of memory cells, or as separate components within the memory module 20.

In operation, the receiver section 48 receives a MMW memory access signal from an allocated interface MMW transceiver. The baseband processing module 46 recovers the memory access request from the baseband or near baseband inbound symbol stream and coordinates execution of the memory access request with the plurality of memory cells 28. For example, if the request is a read instruction, the baseband processing module 46 determines which row or rows the requested data is stored in and, via the bit lines and words lines, accesses the row(s). The accessed row(s) provide its data to the multiplexer 104, the sense amplifier 106, and the latch 108. The baseband processing module 46 retrieves the data from the latch 108 and converts it into an outbound symbol stream. The MMW transceiver converts the outbound symbol stream into a MMW memory access response signal that is transmitted to the interface MMW transceiver.

As another example, if the memory access request is a memory write request, the baseband processing module functions to recover the memory write request from the baseband or near baseband inbound symbol stream. The baseband processing module 46 then determines a location within the array to store the data based on the memory write request. The baseband processing module 46 then provides the data to the location within the array via corresponding bit lines of the plurality of bit lines 100 and corresponding word lines of the plurality of word lines 102.

Figure 11:
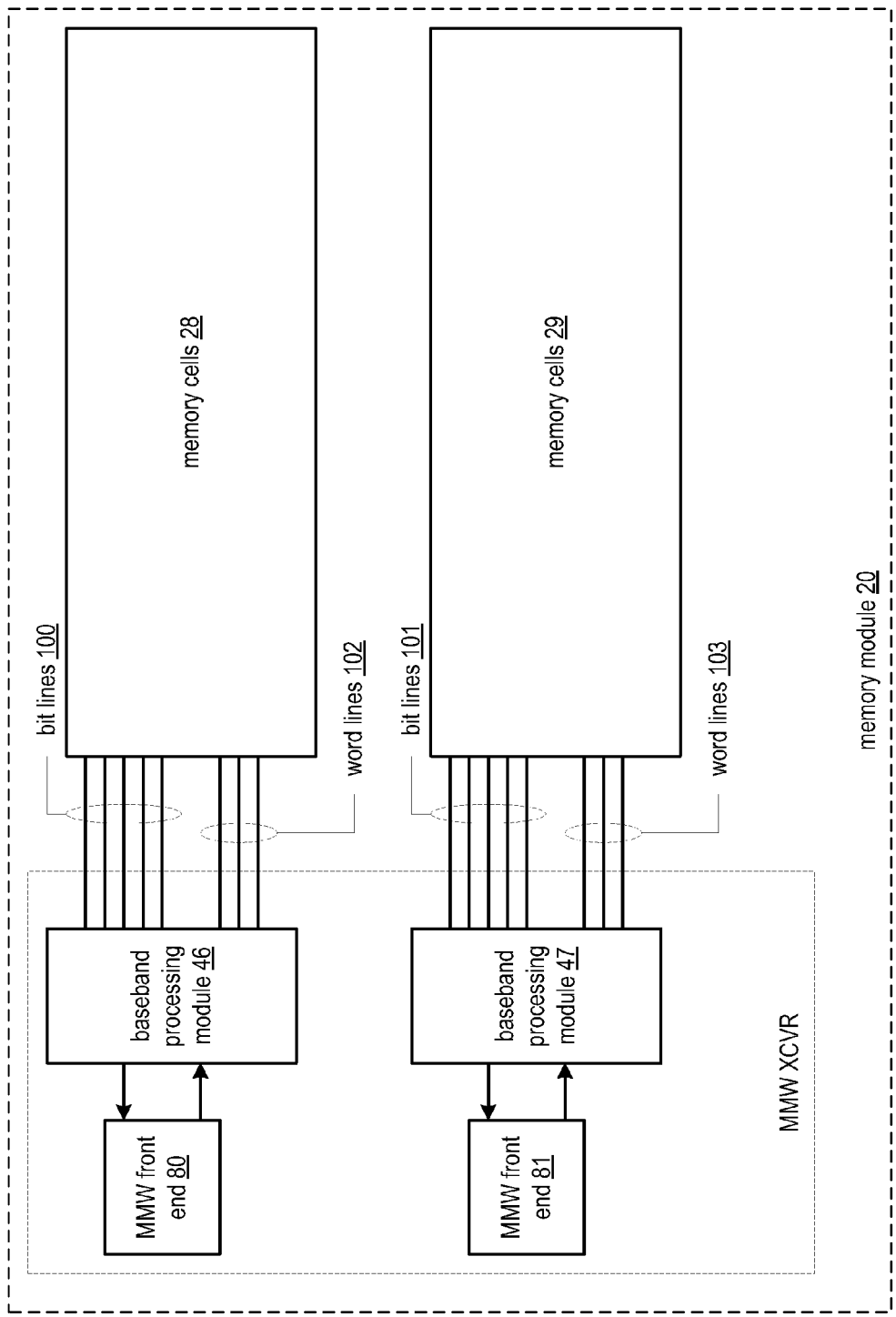
FIG. 11 is a schematic block diagram of another embodiment of a memory module in accordance with the present invention.

FIG. 11 is a schematic block diagram of another embodiment of a memory module 20 that includes a MMW transceiver, a first plurality of memory cells 28 and a second plurality of memory cells 29. The MMW transceiver includes a first baseband processing module 46, a first MMW front-end 80, a second baseband processing module 47, and a second MMW front-end 81. The first and second plurality of memory cells 28 and 29 may each be arranged as a row of memory cells, as a plurality of rows of memory cells, or as an array of memory cells. In this embodiment, the first baseband processing module 46 and the first MMW front-end 80 support memory accesses with the first plurality of memory cells 28 and the second baseband processing module 47 and the second MMW front-end 81 support memory accesses with the second plurality of memory cells 29 in accordance with one or more of the techniques previously discussed.

Figure 12:
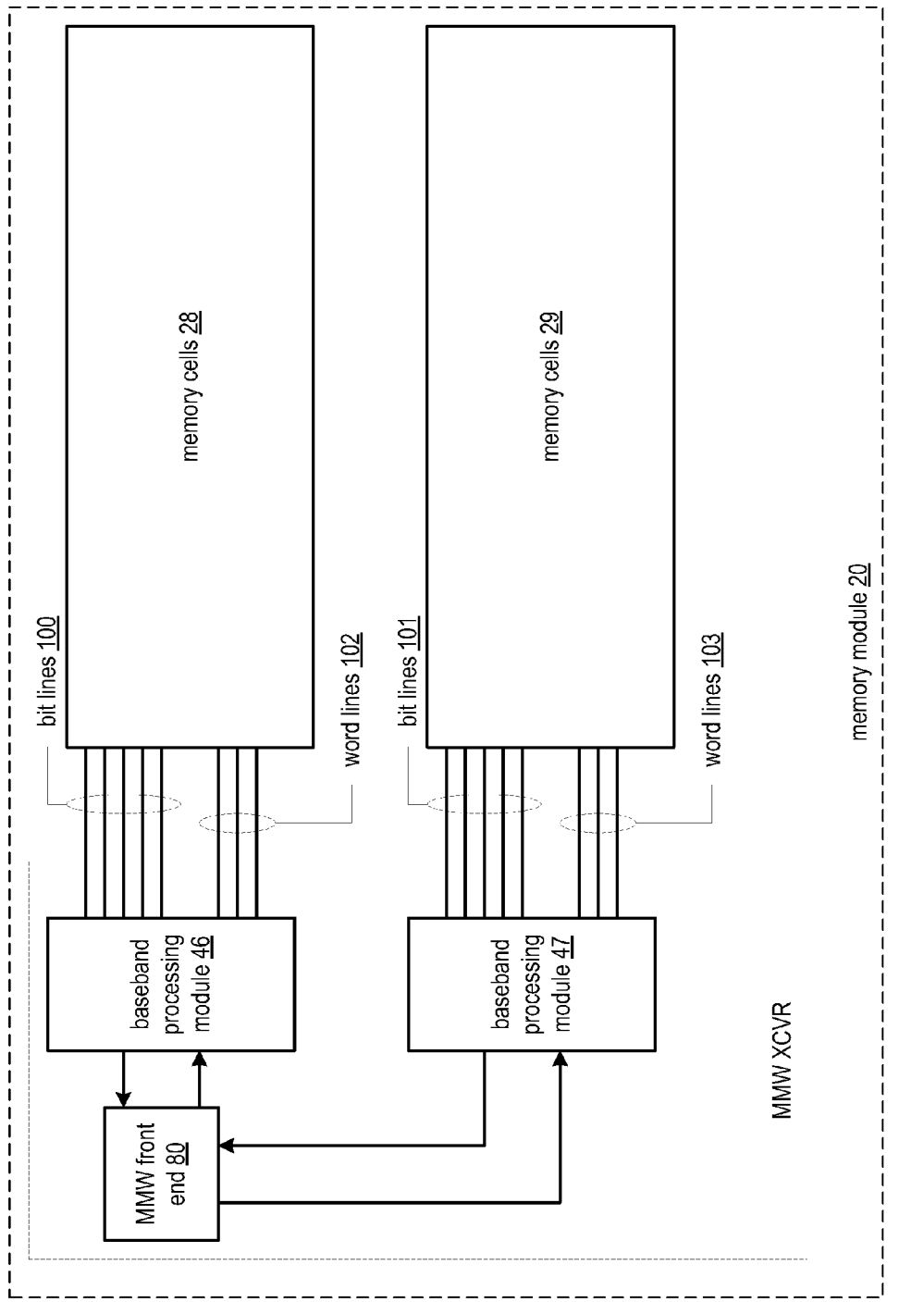
FIG. 12 is a schematic block diagram of another embodiment of a memory module in accordance with the present invention.

FIG. 12 is a schematic block diagram of another embodiment of a memory module 20 that includes a MMW transceiver, a first plurality of memory cells 28 and a second plurality of memory cells 29. The MMW transceiver includes a first baseband processing module 46, a second baseband processing module 47, and a MMW front-end 88. The first and second plurality of memory cells 28 and 29 may each be arranged as a row of memory cells, as a plurality of rows of memory cells, or as an array of memory cells. In this embodiment, the first baseband processing module 46 and the MMW front-end 80 support memory accesses with the first plurality of memory cells 28 and the second baseband processing module 47 and the MMW front-end 80 support memory accesses with the second plurality of memory cells 29 in accordance with one or more of the techniques previously discussed.

Figure 13:
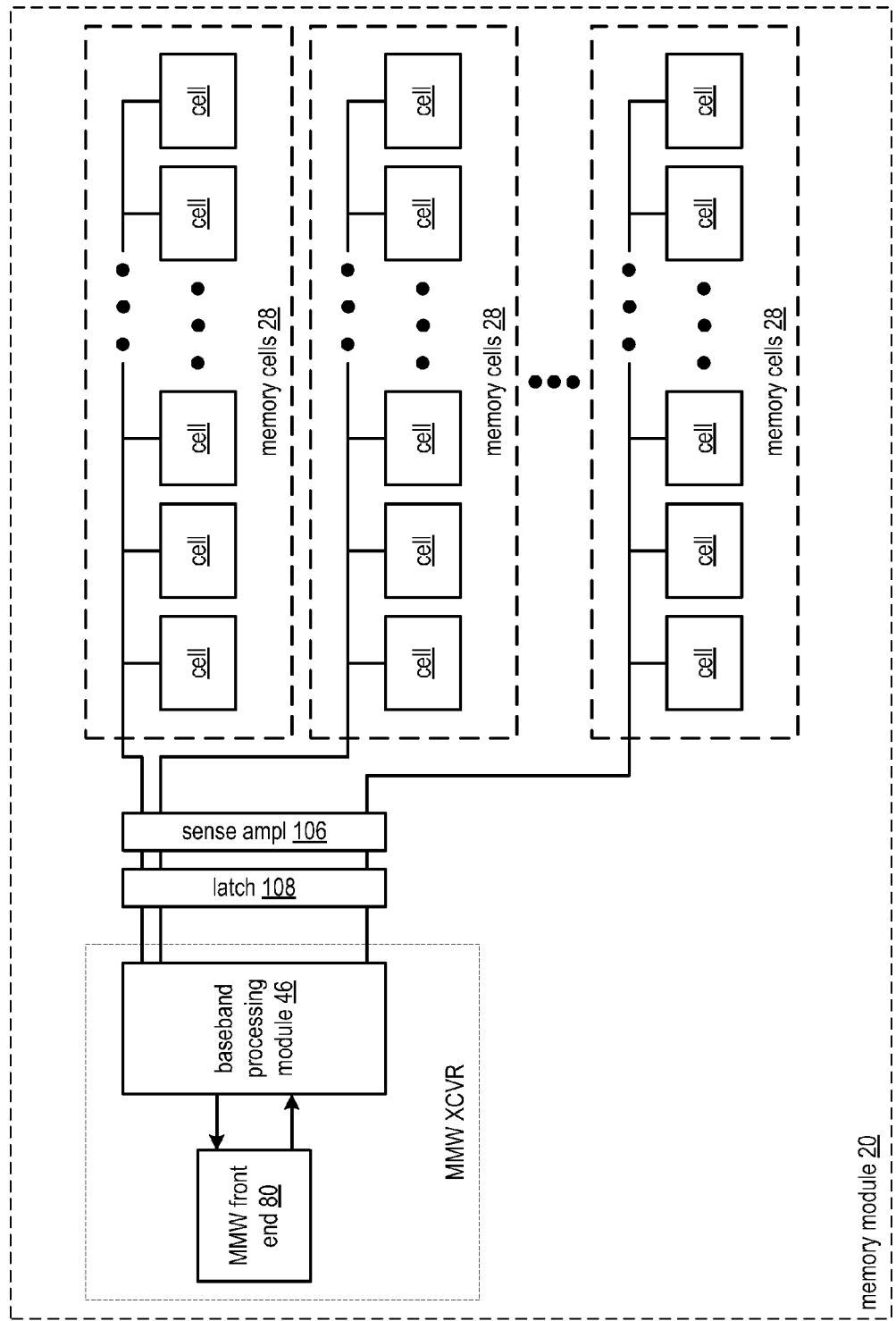
FIG. 13 is a schematic block diagram of another embodiment of a memory module in accordance with the present invention.

FIG. 13 is a schematic block diagram of another embodiment of a memory module 20 that includes the MMW transceiver, a plurality of memory cells 28 arranged in one or more rows, a sense amplifier 106, and a latch 108. The memory MMW transceiver includes the baseband processing module 46 and a MMW front end 80 that includes the receiver section 48 and the transmitter section 50. The baseband processing module 46 is coupled to the one or more rows of memory cells via the sense amplifier 106, the latch 108, and an address line (not shown).

In operation, the receiver section 48 receives a MMW memory access signal from an allocated interface MMW transceiver. The baseband processing module 46 recovers the memory access request from the baseband or near baseband inbound symbol stream and coordinates execution of the memory access request with the plurality of memory cells 28. For example, if the request is a read instruction, the baseband processing module 46 determines which row or rows the requested data is stored in and, via the address line, accesses the row(s). The accessed row(s) provide its data to the sense amplifier 106 and the latch 108. The baseband processing module 46 retrieves the data from the latch 108 and converts it into an outbound symbol stream. The MMW transceiver converts the outbound symbol stream into a MMW memory access response signal that is transmitted to the interface MMW transceiver.

As another example, if the memory access request is a memory write request, the baseband processing module functions to recover the memory write request from the baseband or near baseband inbound symbol stream. The baseband processing module 46 then determines a row or rows to store the data based on the memory write request. The baseband processing module 46 then provides the data to the row or rows via the address line or a data line.

Figure 14:
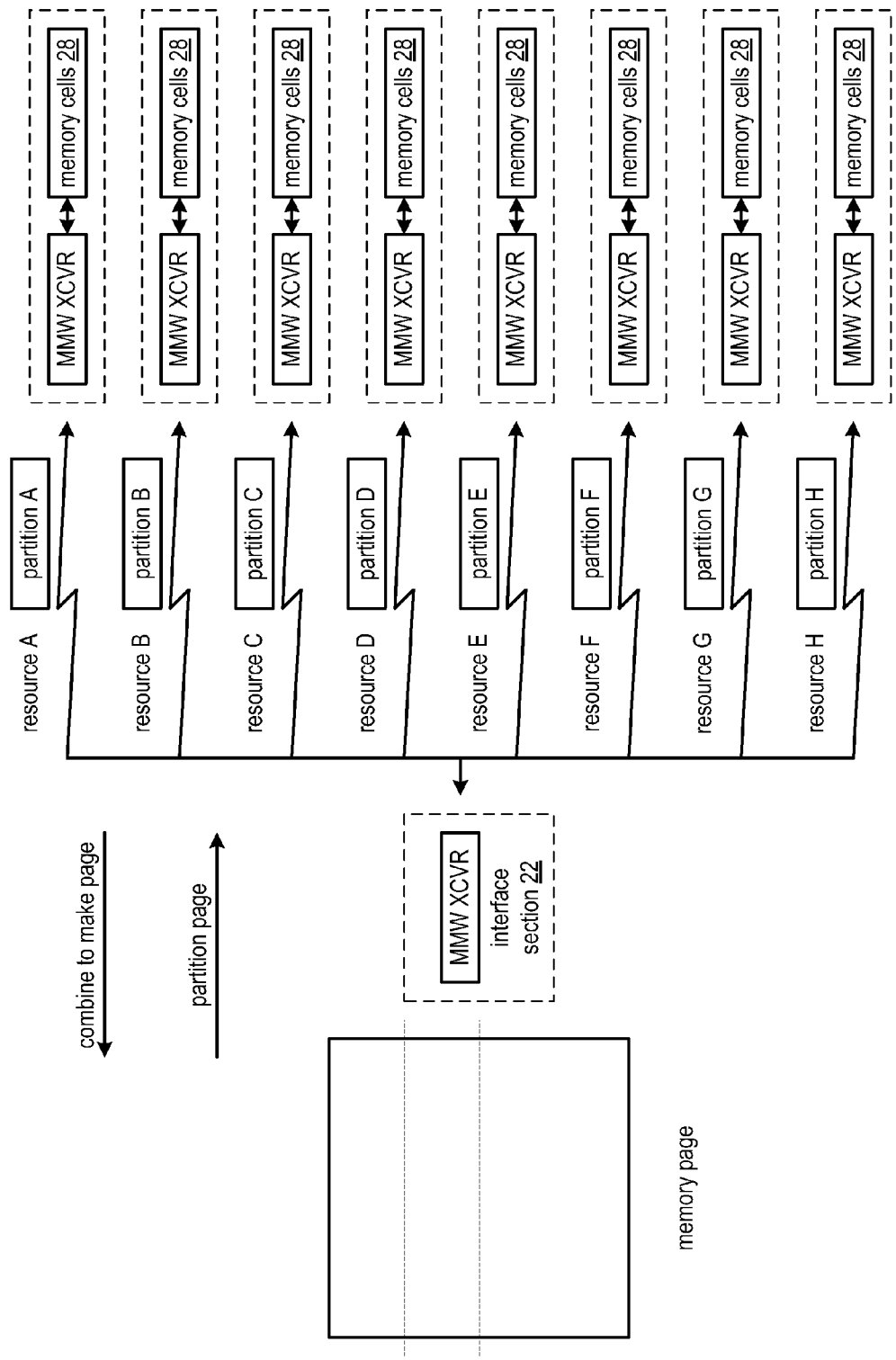
FIG. 14 is a diagram of an example of configuring memory in accordance with the present invention.

FIG. 14 is a diagram of an example of configuring a memory page (e.g., 4 KBytes or more), or other memory segment. As an example of storing the memory page, the interface section 22 partitions the memory page into a plurality of partitions (e.g., 2 or more; 8 in this example). The partitions (e.g., partition A-partition H) are provided to the assigned memory modules 20 via allocated communication resources (e.g., resource A-resource H). A resource may be a channel within a frequency band, a division multiple access slot (e.g., TDMA slot, FDMA slot, CDMA slot, etc.).

To read the data stored in the memory block (i.e., the eight memory modules 20), the interface section 22 receives the partitions (e.g., partition A-partition H) via the allocated resources (e.g., resource A-resource H). The interface section 22 combines the partitions to recreate the memory page and converts it into an outbound MMW signal. The interface section 22 may use a different resource, or resources, to transmit or receive a MMW signal containing the memory page that it uses to communicate with the memory modules 20. Alternatively, the interface section 22 may use one to all of the resources used to communicate with the memory modules for communicating the memory page with an external device.

FIG. 15 is a diagram of an example of wireless communication resources within a plurality of frequency bands (e.g., frequency band A-C). The frequency bands may be within the unlicensed spectrum. For example, the frequency bands may be in the 29 frequency band, the 60 GHz frequency band, or other higher frequency bands. As shown, each frequency band is divided into a plurality of channels. The number of channels within a frequency band may conform to conventional channel definition schemes or customized for the configurable memory device 14. Each channel may be partitioned into slots or subcarriers that allow a channel to be shared by a plurality of components of the configurable memory 14. The slot partitioning may be done in a time domain (e.g., TDMA), in a frequency domain (e.g., FDMA, OFDM), in a code domain (e.g., CDMA), etc.

FIG. 16 is a diagram of an example of allocating wireless communication resources. In this example, the resource allocations are stored in a memory block allocation map that includes fields for a virtual address, memory modules, interface transceiver, interface resources, and memory module resources. As an example, virtual memory address space 0000-0FFF is supported by a memory block that includes memory modules 00-0F. Interface transcevier 0 is allocated to support the memory block (i.e., is the interface to external devices for the memory block) and utilizes communication resources 00-01. The interface transceiver 0 communicates with the memory modules using communication resources 02-0F. As previously discussed, a communication resource may be one or more channels within one or more frequency band or one or more division multiple access slots of one or more channels.

As another example, virtual memory address space 1000-1FFF is supported by a memory block that includes memory modules 10-1F. Interface transcevier 1 is allocated to support the memory block and utilizes communication resources 10-11. The interface transceiver 1 communicates with the memory modules using communication resources 12-1F. As yet another example, virtual memory address space 2000-2FFF is supported by a memory block that includes memory modules 20-2F. Interface transcevier 2 is allocated to support the memory block and utilizes communication resources 20-21. The interface transceiver 2 communicates with the memory modules using communication resources 22-2F.

Figure 17:
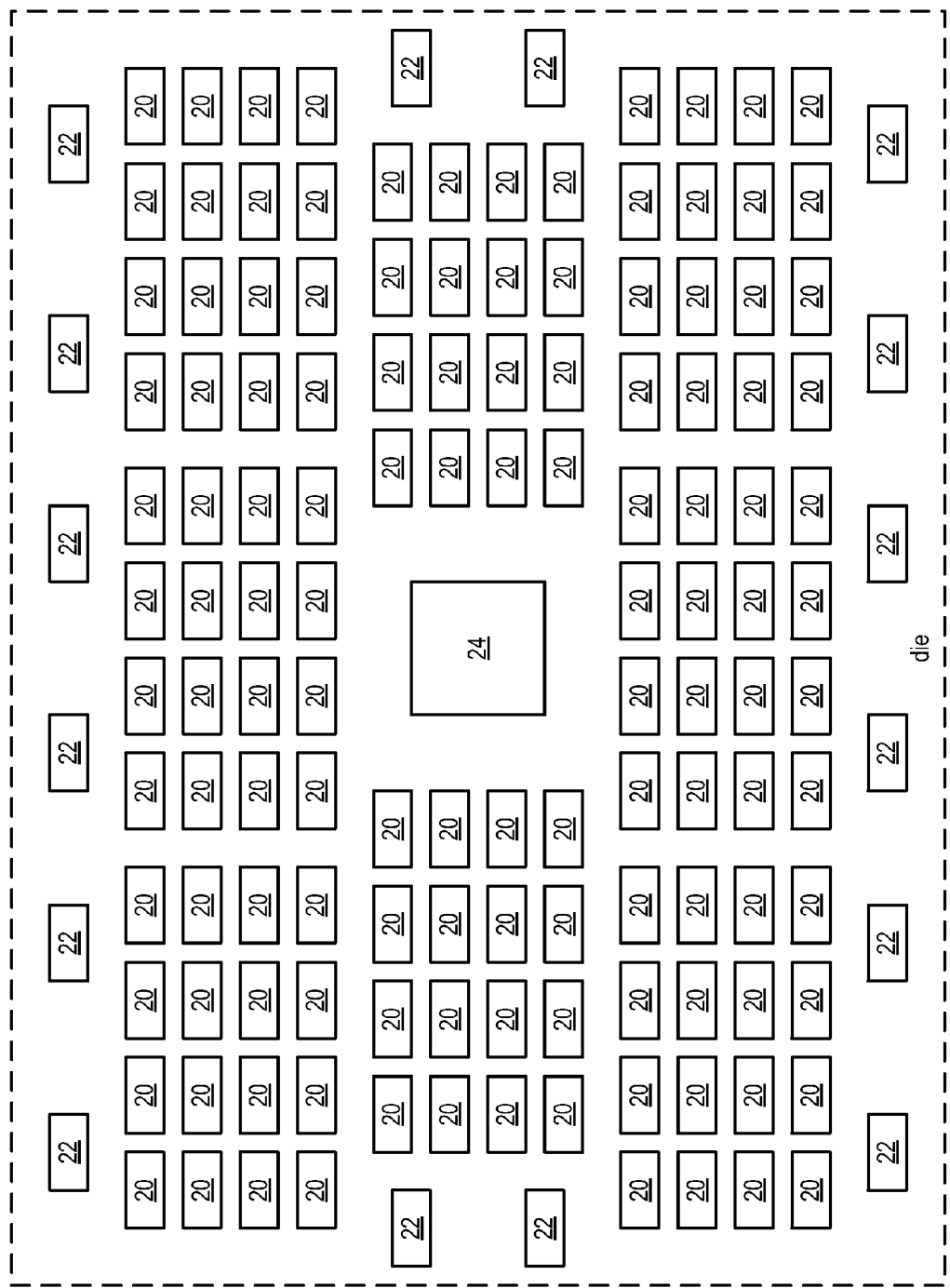
FIG. 17 is a diagram of an example of a die that supports a configurable memory in accordance with the present invention.

FIG. 17 is a diagram of an example of a die that supports a configurable memory 14. The configurable memory 14 includes a plurality of memory modules 20, a plurality of interface sections 22, and an internal configuration section 24. The layout of the die may include groupings of memory modules with a few interface sections 22 proximal thereto and at the perimeter of the die. The die may be supported by a package substrate that includes shielding such that the MMW communications of the configurable memory are substantially contained within the IC and have negligible interference with other components. In addition, the transmit power of the MMW transceivers can be in the micro or nano watts, since the distance a MMW signal travels is in the millimeter range.

Figure 18:
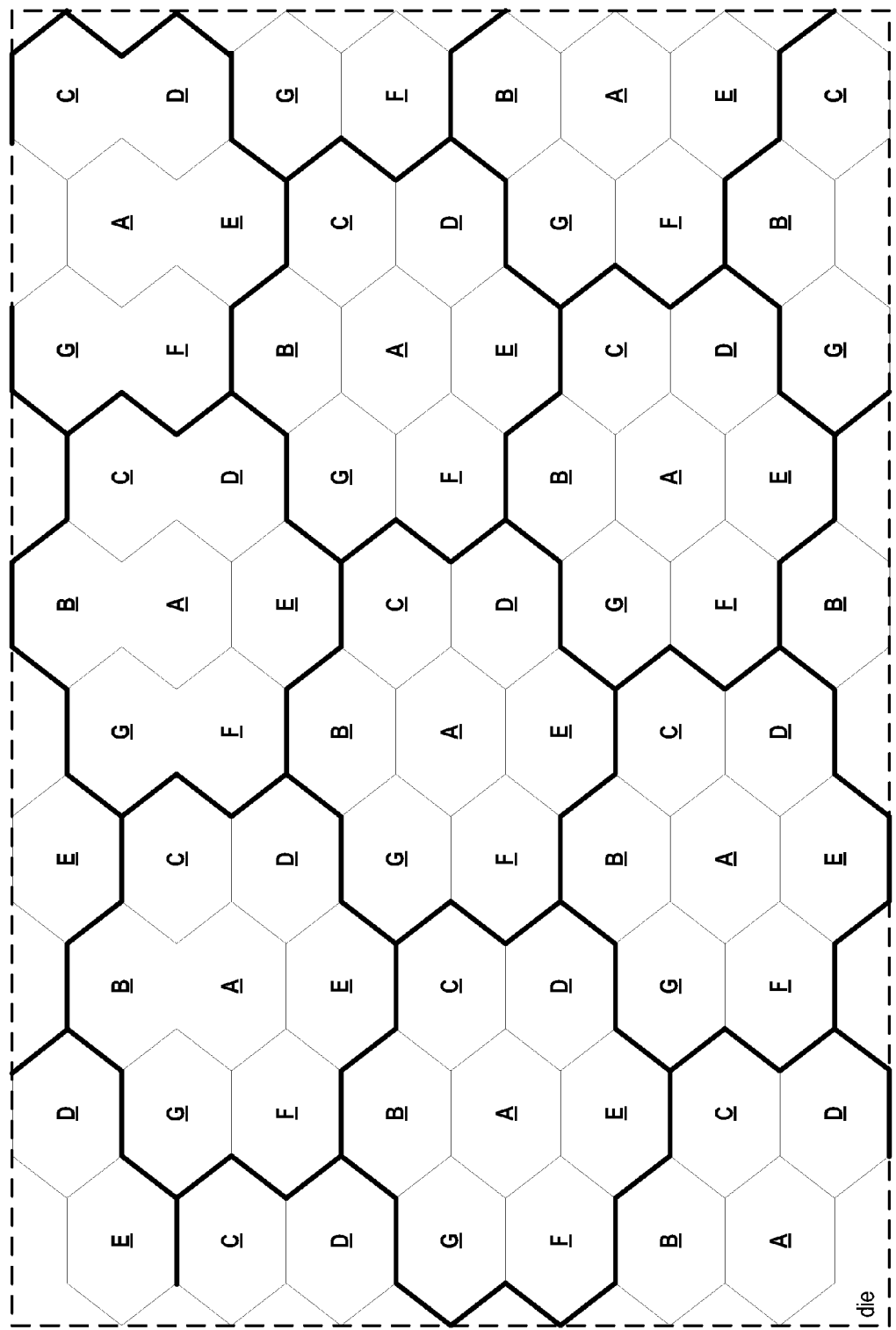
FIG. 18 is a diagram of an example of wireless communication resource re-use on a die in accordance with the present invention.

FIG. 18 is a diagram of an example of wireless communication resource re-use pattern on a die. Since the transmit power is very low and the interface section to memory module communications can be confined to a particular area of the die, the communication resources may be re-used. In this example, the communication resources are grouped into seven groups A-G, where each group includes a plurality of communication resources. In this manner, numerous wireless communications can occur on die with negligible interference.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output (s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A configurable memory, comprising:
    a plurality of memory modules in the configurable memory, wherein the plurality of memory modules includes memory MMW transceivers and a plurality of memory cells; and
    an internal configuration section that includes a memory management millimeter wave (MMW) wireless transceiver, wherein the internal configuration section is configured to:
        select a set of the plurality of memory modules to form a memory block in the configurable memory;
        identify one or more memory MMW transceivers from a plurality of MMW transceivers to support the memory block; and
        generate a configuration signal including configuration information for the selected set of the plurality of memory modules to form the memory block and the identified one or more memory MMW transceivers to support the memory block;
        convert the configuration signal into a MMW wireless configuration signal; and
        transmit the MMW wireless configuration signal by the management MMW wireless transceiver to the one or more memory MMW transceivers for the selected set of the plurality of memory modules to form the memory block and the identified one or more memory MMW transceivers to support the memory block.

2. The configurable memory of claim 1, wherein the internal configuration section is configured to select the set of the plurality of memory modules to form the memory block in the configurable memory by:
    receiving a configuration command that defines size and data format of the memory block;
    determining a number of memory modules based on the size;
    allocating the set of the plurality of memory modules in accordance with the number of memory modules; and
    determining arrangement of the set of the plurality of memory modules based on the size and the data format.

3. The configurable memory of claim 1, wherein the internal configuration section is configured to select the set of the plurality of memory modules to form the memory block in the configurable memory by:
    receiving a write request;
    determining size of data to be written based on the write request;
    determining a number of memory modules based on the size of data; and
    allocating the set of the plurality of memory modules in accordance with the number of memory modules.

4. The configurable memory of claim 1, wherein the memory MMW transceiver in the memory module of the set of the plurality of memory modules comprises:
    a MMW receiver section configured to:
        receive a MMW memory access signal;
        convert the MMW memory access signal into an inbound symbol stream;
    a baseband processing module configured to:
        recover a memory access request from the inbound symbol stream;
        coordinate execution of the memory access request with the plurality of memory cells;
        generate a memory execution response when required; and
        convert the memory execution response into the outbound symbol stream; and
    a MMW transmitter section configured to:
        convert an outbound symbol stream into a MMW memory response signal; and
        transmit the MMW memory response signal.

5. The configurable memory of claim 1, further comprising:
    one or more interface sections, wherein an interface section includes one or more millimeter wave (MMW) transceivers;
    wherein the internal configuration section is configured to identify at least one interface section to a wireless link to the memory block;
    wherein the memory management MMW transceiver is configured to transmit the MMW configuration signal to the at least one identified interface section.

6. The configurable memory of claim 5, wherein the memory MMW transceiver in the memory module of the set of the plurality of memory modules comprises:
a MMW front end configured to:
receive a MMW memory access signal from the at least one identified interface section;
convert the MMW memory access signal into an inbound symbol stream;
convert an outbound symbol stream into a MMW memory response signal; and
transmit the MMW memory response signal to the at least one identified interface section; and
a baseband processing module configured to:
recover a memory access request from the inbound symbol stream;
coordinate execution of the memory access request with the plurality of memory cells;
generate a memory execution response when required; and
convert the memory execution response into the outbound symbol stream.

7. The configurable memory of claim 5, wherein the plurality of memory cells are arranged in a plurality of rows; and
wherein the memory MMW transceiver in the memory module of the set of the plurality of memory modules includes a baseband processing module and a plurality of MMW front ends, wherein a MMW front end of the plurality of MMW front ends is configured to:
receive a MMW memory access signal from the at least one identified interface section for a corresponding row of the plurality of rows;
convert the MMW memory access signal into a baseband or near baseband inbound symbol stream;
convert a baseband or near baseband outbound symbol stream into a MMW memory response signal; and
transmit the MMW memory response signal to the interface MMW transceiver; and
the baseband processing module functions to:
recover a memory access request from the baseband or near baseband inbound symbol stream;
coordinate execution of the memory access request with the corresponding row of the plurality of rows;
generate a memory execution response when required; and
convert the memory execution response into the baseband or near baseband outbound symbol stream.

8. The configurable memory of claim 1 further comprising;
a die that supports at least the plurality of memory modules and the internal configuration section; and
a package substrate that supports at least the die.

9. The configurable memory of claim 1 further comprising:
millimeter wave shielding proximal to the die and the package substrate.

10. A memory module, comprising:
an array of memory cells having a plurality of bit lines and a plurality of word lines; and
a millimeter wave (MMW) transceiver coupled to the array, wherein the MMW transceiver is configured to receive a MMW wireless memory access signal; and
one or more a processing modules configured to:
convert the MMW wireless memory access signal into a memory access request;
determine a location within the array to access based on the memory access request; and
access the location within the array via corresponding bit lines of the plurality of bit lines and corresponding word lines of the plurality of word lines in accordance with the memory access request.

11. The memory module of claim 10, wherein the memory access request is a memory read request; and
wherein the processing module is further configured to:
retrieve data from the location within the array in accordance with the memory read request; and
convert the retrieved data into an outbound symbol stream formatted in accordance with a wireless protocol; and
wherein the MMW transceiver further functions to:
convert the outbound symbol stream into a MMW retrieved data signal; and
transmit the MMW retrieved data signal.

12. The memory module of claim 10 wherein the memory access request is a memory write request, wherein the memory write request includes data to be stored; and the processing module is further configured to:
determine a location within the array of memory cells to store the data based on the memory write request; and
provide the data to the location within the array of memory cells via corresponding bit lines of the plurality of bit lines and corresponding word lines of the plurality of word lines.

13. The memory module of claim 10, wherein the array of memory cells comprises:
a multiplexer coupled to the plurality of bit lines;
a sense amplifier coupled to an output of the multiplexer; and
a latch coupled to an output of the sense amplifier.

14. The memory module of claim 10, wherein the processing module comprises:
a multiplexer coupled to the plurality of bit lines;
a sense amplifier coupled to an output of the multiplexer; and
a latch coupled to an output of the sense amplifier.

15. A configurable memory device, comprising:
a plurality of memory modules, wherein at least one or more of the plurality of memory modules includes:
a plurality of memory lines;
a MMW front-end, wherein the MMW front-end is configured to:
receive a MMW signal including a memory access request;
convert the MMW signal into an inbound symbol stream; and
a processing module configured to:
recover the memory access request from the inbound symbol stream;
determine a location within the plurality of memory lines to access based on the memory access request;
access the location via at least one of the plurality of memory lines in accordance with the memory access request.

16. The configurable memory device of claim 15, wherein the memory access request includes a memory read request; and
wherein the processing module is configured to:
recover the memory read request from the inbound symbol stream;
determine a location within the plurality of memory lines to access based on the memory read request;
access the location via at least one of the plurality of memory lines in accordance with the memory read request;

receive retrieved data from the at least one of the plurality of memory lines in accordance with the memory read request; and convert the retrieved data into an outbound symbol stream formatted in accordance with a wireless protocol; and wherein the MMW front-end is further configured to:

convert the outbound symbol stream into a MMW retrieved data signal; and transmit the MMW retrieved data signal.

17. The configurable memory device of claim 15 wherein the memory access request includes a memory write request, wherein the memory write request includes data to be stored; and wherein the processing module is configured to:

recover the memory write request from the inbound symbol stream;

determine a location within the plurality of memory lines to access based on the memory write request;

access the location via at least one of the plurality of memory lines in accordance with the memory write request; and provide the data to be stored to the at least one of the plurality of memory lines.

18. The configurable memory device of claim 15, wherein the processing module comprises:

a sense amplifier coupled to the plurality of memory lines; and a latch coupled to an output of the sense amplifier.

19. The configurable memory device of claim 15, wherein the at least one or more of the plurality of memory modules further comprises:

a second plurality of memory lines;

a second MMW front-end configured to:

receive a second MMW memory access signal;

convert the second MMW memory access signal into an inbound symbol stream; a second processing module configured to:

recover the second memory access request from the inbound symbol stream; and access the second plurality of memory lines in accordance with the second memory access request.

20. The configurable memory device of claim 15, wherein the array of memory cells comprises:

a multiplexer coupled to the plurality of memory lines;

a sense amplifier coupled to an output of the multiplexer; and a latch coupled to an output of the sense amplifier.

* * * * *

UNITED STATES PATENT AND TRADEMARK OFFICE
CERTIFICATE OF CORRECTION

| | | |
|---|---|---|
| PATENT NO. | : 8,621,175 B2 | Page 1 of 1 |
| APPLICATION NO. | : 13/429685 | |
| DATED | : December 31, 2013 | |
| INVENTOR(S) | : Ahmadreza Rofougaran et al. | |

It is certified that error appears in the above-identified patent and that said Letters Patent is hereby corrected as shown below:

In the Claims

Col. 17, line 61, in claim 10: after "one of more" delete "a"

Signed and Sealed this
Second Day of September, 2014

Michelle K. Lee
*Deputy Director of the United States Patent and Trademark Office*